United States Patent
Pernyeszi

Patent Number: 5,969,547
Date of Patent: Oct. 19, 1999

[54] ANALOG SIGNAL PROCESSING CIRCUIT WITH NOISE IMMUNITY AND REDUCED DELAY

[75] Inventor: Joseph Pernyeszi, Scotts Valley, Calif.

[73] Assignee: General Electronics Applications, Inc., Scotts Valley, Calif.

[21] Appl. No.: 08/957,672

[22] Filed: Oct. 24, 1997

[51] Int. Cl.⁶ .................................................. H03K 3/295
[52] U.S. Cl. ............................................ 327/73; 327/205
[58] Field of Search ............................. 327/205, 79, 50, 327/552, 558, 59, 65, 73, 206

[56] References Cited

U.S. PATENT DOCUMENTS

| | | | |
|---|---|---|---|
| 5,019,722 | 5/1991 | Hess et al. .................................. | 327/79 |
| 5,061,859 | 10/1991 | Lovelace et al. ......................... | 327/514 |
| 5,341,033 | 8/1994 | Koker ...................................... | 327/206 |

Primary Examiner—Dinh T. Le
Attorney, Agent, or Firm—Townsend and Townsend Crew LLP

[57] ABSTRACT

An improved pulse detection circuit provides for a reduced delay response and noise immunity. The pulse detection circuit includes a comparator with a hysteresis circuit providing a hysteresis response on the order of a minimum pulse width and a reference circuit having a time constant which is a function of unexpected signal input level.

15 Claims, 5 Drawing Sheets

ANALOG SIGNAL PROCESSING CIRCUIT WITH NOISE IMMUNITY AND REDUCED DELAY

BACKGROUND OF THE INVENTION

The present invention relates to the field of signal detection. More specifically, one embodiment of the invention provides an improved circuit for detecting a signal which is a pulse stream with at least some predetermined characteristics using those predetermined conditions to detect the pulse stream accurately through noise added to the signal.

Pulse detection is a well known form of signal detection. Typically, a binary (i.e., comprising logical "0"'s or "1"'s) data stream is encoded as pulses in a pulse stream. The presence of a pulse in a certain time window encodes for a logical "1" and the absence of a pulse in the time window encodes for a logical "0". In a variation of such a system, pulse widths carry the information, with a pulse's width representing a digital value. With this "pulse width encoding", there are a limited number of valid widths a pulse can have. In yet another variation, information is encoded in the falling or rising edges of a signal. Regardless of how the information is encoded, accurate detection and decoding rely on precise detection of the beginnings and/or ends of pulses.

Pulse detection is needed in, for example, modems, barcode readers, and optically-coupled transmitter/receiver pairs. The latter includes fiber optic systems and optocouplers.

In such systems, the information is clearly encoded and the pulses are transmitted with very sharp rising and falling edges. However, during transmission, pulse edges get distorted due to channel bandwidth limitations, detection circuit bandwidth limitations and noise.

A detection circuit normally amplifies an incoming signal and then applies the amplified signal to a decision circuit. If the level of the amplified signal is below a predetermined level (the "detection threshold"), the decision circuit outputs a logical "0" as its estimation of the digital value encoded in the signal. If the signal is above the detection threshold, then the decision circuit outputs a logical "1".

An example of a known detection circuit 10 is shown in FIG. 1. Detection circuit 10 is shown comprising an amplifier 12, a peak detector 14 and a comparator 16. Waveforms at nodes 20, 22, 24, 26 and 28 of detection circuit 10 are shown in FIG. 2 as waveforms W20, W22, W24, W26 and W28, respectively. The top portion of FIG. 2 shows the original signal which, after transmission and amplification by amplifier 12, is waveform W20. The signal at node 20 is applied to peak detector 14, resulting in a positive peak signal (W22) and a negative peak signal (W24), which are averaged (W26) and used as the detection threshold, which comparator 16 compares with the amplified input signal from node 20. Comparator 16 outputs a logical "1" at node 28 if node 20 is more positive than the sum signal at node 26, otherwise it outputs a logical "0". The output of comparator 16 changes when the signal at node 20 is about halfway between its positive and negative peaks.

Another known detection circuit 30 is shown in FIG. 3, with the waveforms shown in FIG. 4. While detection circuit 30 is more complex than decision circuit 10 shown in FIG. 1, it has additional capabilities. For example, detection circuit 30 has peak detectors 31 which are resetable. Each peak detector 31 acquires an updated peak value after each positive or negative transition of the output signal. Each peak detector 31 has a comparator 34 with a small hysteresis to prevent oscillations near the switching point. As with detection circuit 10, the input signal is amplified by an amplifier 32, and the outputs of peak detectors 31 are averaged at node 56 and used as the threshold voltage for comparator 38. The output of detection circuit 30 is at node 60. That output is also used to reset the switches in peak detectors 31, as the output signal at node 60 is fed to edge detectors 42 (one directly and one after being inverted by an inverter 40) coupled to the switches.

Waveforms at nodes 50, 52, 54, 56, 58, 60, 62 and 64 of detection circuit 30 are shown in FIG. 4 as waveforms W50, W52, W54, W56, W58, W60, W62 and W64, respectively.

Yet another detection circuit 70 is shown in FIG. 5, with associated waveforms shown in FIG. 6. Detection circuit provides an output response with less delay than other detection circuits, and has better transition detection, but requires a noise-free environment. The increased noise sensitivity comes from a peaking circuit 82, which is needed for the improved signal transition detection. Peaking circuit 82 amplifies noise and interference more than the signal. Consequently, at the output of the peaking circuit, the signal-to-noise ratio is much worse than at the input. This makes the circuit unreliable in noisy environments. When the noise is amplified, multiple transitions might be spuriously detected at transition points, such as t1–t5 shown in FIG. 6., where only single transitions should have been detected.

From the above it is seen that an improved detection circuit is needed.

SUMMARY OF THE INVENTION

An improved detection circuit is provided by virtue of the present invention. In one embodiment, a detection circuit according to the present includes a comparator with a hysteresis circuit comprising a first impedance coupled between a positive comparator input and a comparator output and a second impedance coupled between an input node, and having a reference circuit comprising a capacitor coupled between a negative comparator input and ground and a resistor coupled between the comparator output and the negative comparator input. The time constant of the hysteresis circuit is a function of at least a first predetermined signal criteria and the time constant of the reference circuit is a function of at least a second predetermined signal criteria.

The detection circuit has the advantage that the threshold moves based on knowledge of the input signal and the circuit has a high noise margin. The circuit is useful where transitions must be deleted with high accuracy.

A further understanding of the nature and advantages of the inventions herein may be realized by reference to the remaining portions of the specification and the attached drawings.

DESCRIPTION OF THE PREFERRED EMBODIMENTS

Figure 1:
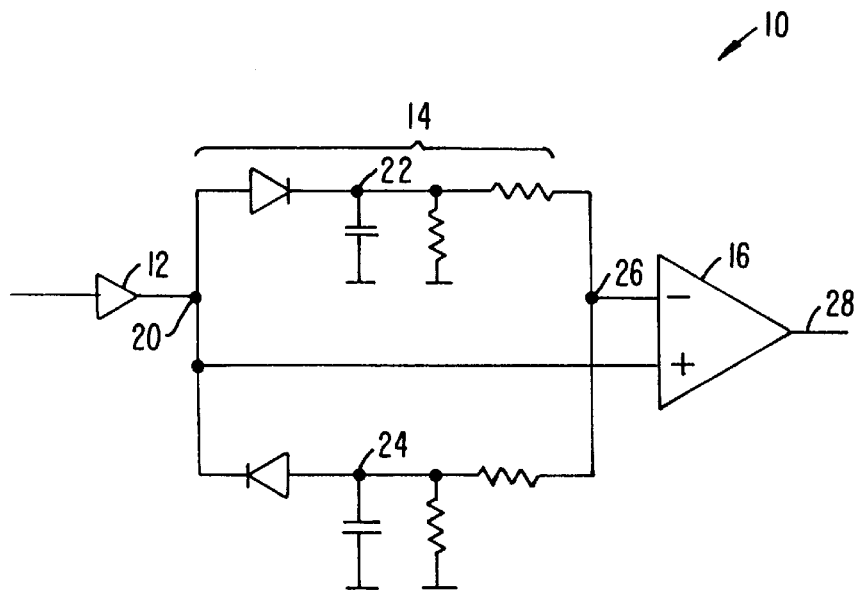
FIG. 1 is a schematic diagram of a prior art pulse detection circuit.
Figure 2:
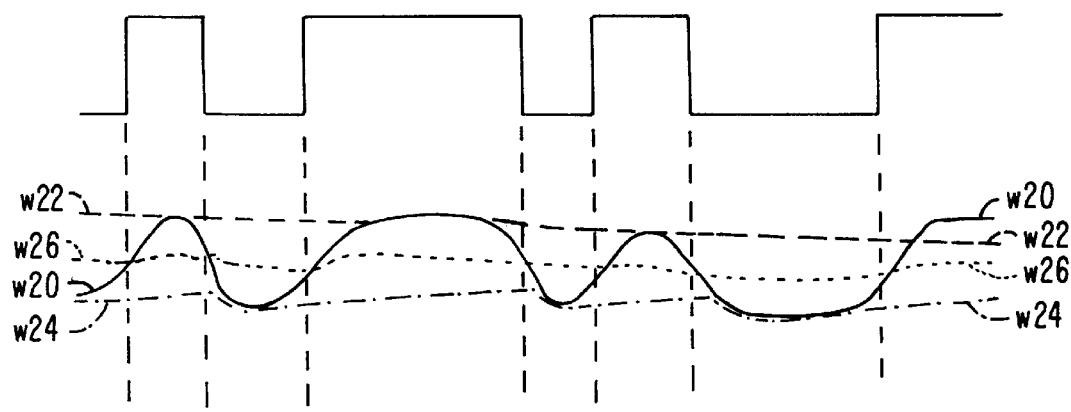
FIG. 2 is a set of waveforms of signals at nodes of the pulse detection circuit shown in FIG. 1.
Figure 3:
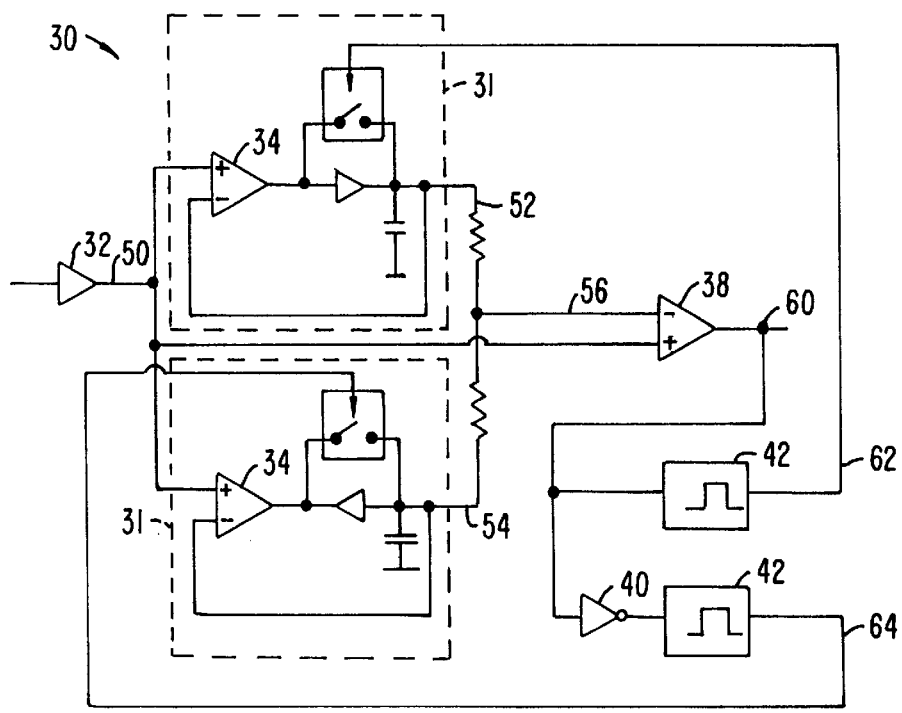
FIG. 3 is a schematic diagram of another prior art pulse detection circuit.
Figure 4:
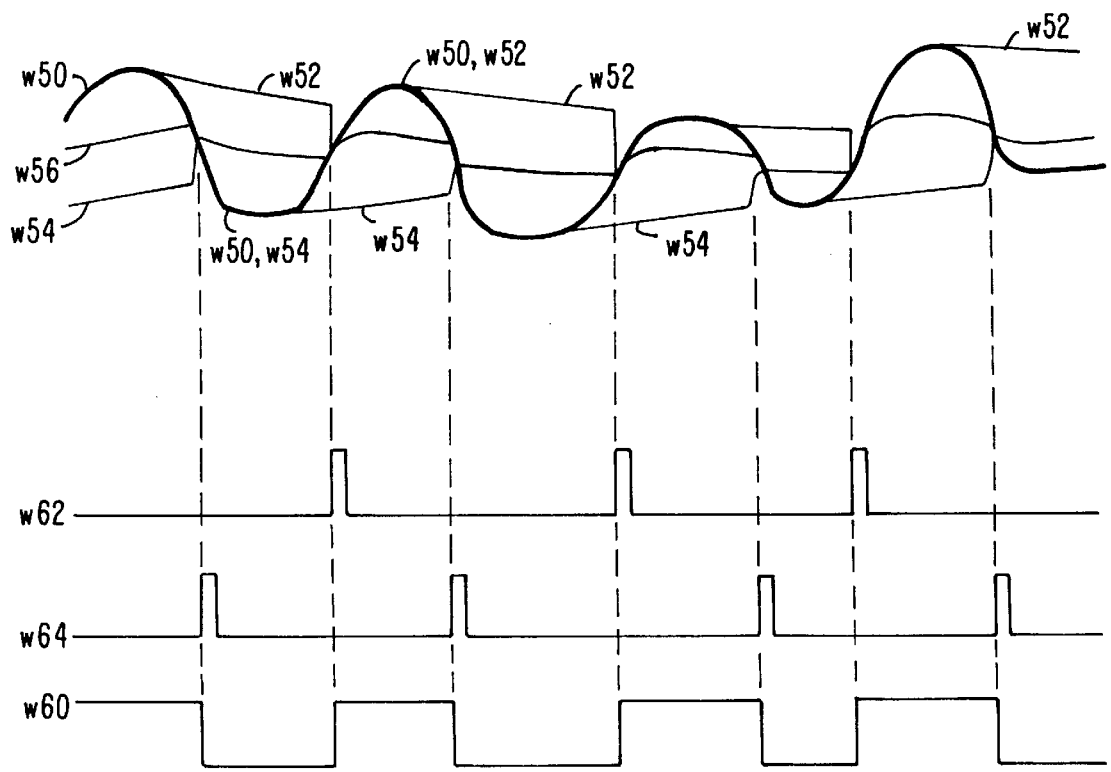
FIG. 4 is a set of waveforms of signals at nodes of the pulse detection circuit shown in FIG. 3.
Figure 5:
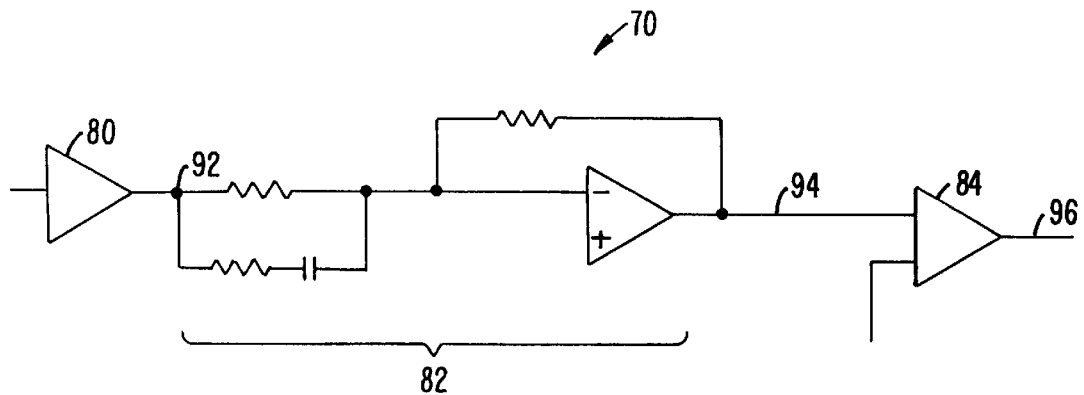
FIG. 5 is a schematic diagram of yet another prior art pulse detection circuit.
Figure 6:
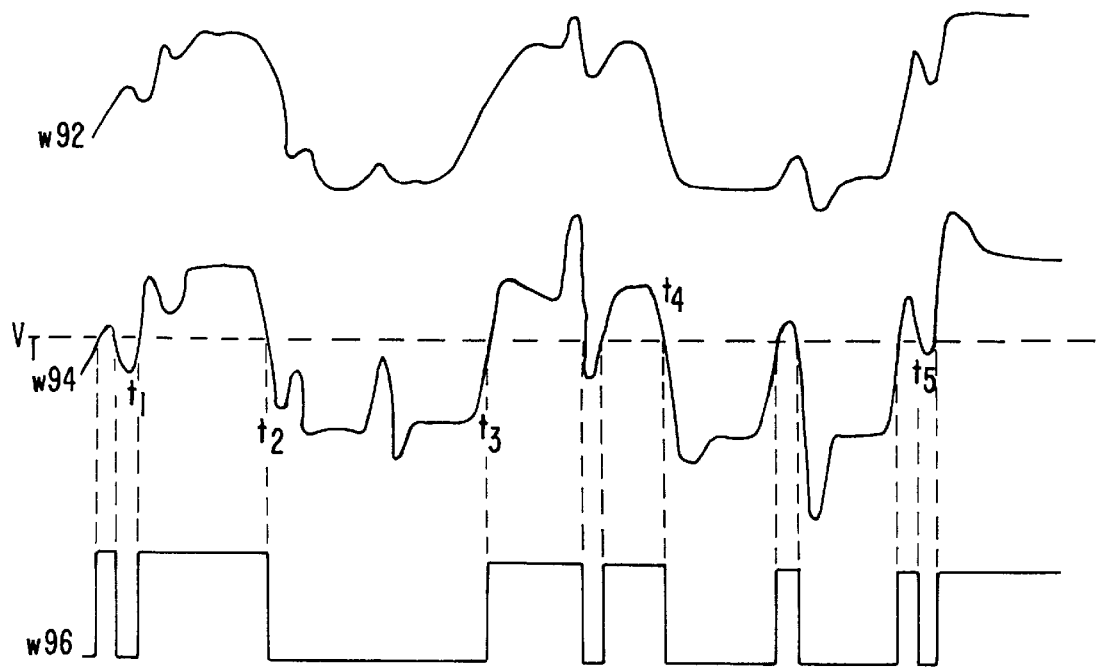
FIG. 6 is a set of waveforms of signals at nodes of the pulse detection circuit shown in FIG. 5.
Figure 7:
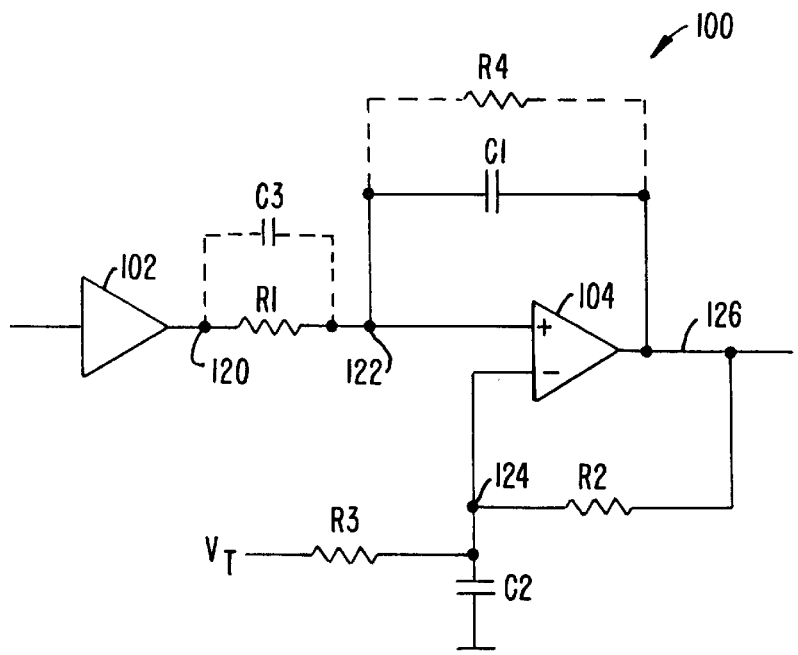
FIG. 7 is a schematic diagram of one embodiment of a pulse detection circuit according to the present invention.

Referring to FIG. 7, one embodiment of a pulse detection circuit 100 according to the present invention is there shown. Pulse detection circuit 100 anticipates the direction of the next transition, but also provides high noise immunity at the transition points to avoid generating multiple transitions on the output for single transition.

Pulse detection circuit 100 is shown including an amplifier 102, a comparators 104, capacitors C1 and C2, and resistors R1, R2 and R3. Optionally, a resistor R4 and/or a capacitor C3 are used. Waveforms at nodes 120, 122, 124 and 126 of pulse detection circuit 100 are shown in FIG. 8 as waveforms W120, W122, W124 and W126, respectively.

The operation of pulse detection circuit 100 is based on some knowledge of the input signal, namely the approximate signal timing and approximate signal amplitude. For digital data transmission, the signal timing is usually fixed at a known baud rate, and for analog signals, a minimum time between transitions is usually known. With a two-level signal, it can also be assumed that every positive transition is followed by a negative transition and vice versa. If the pulse-to-pulse amplitude variation is known, the threshold can be adjusted to reduce delay resulting from the slow transition time of the input signal. Since the signal will have a negative transition after a positive transition, the detection threshold can be moved in the negative direction so comparator 104 will respond with a transition at its output shortly after the input signal level changes at node 120.

Figure 8:
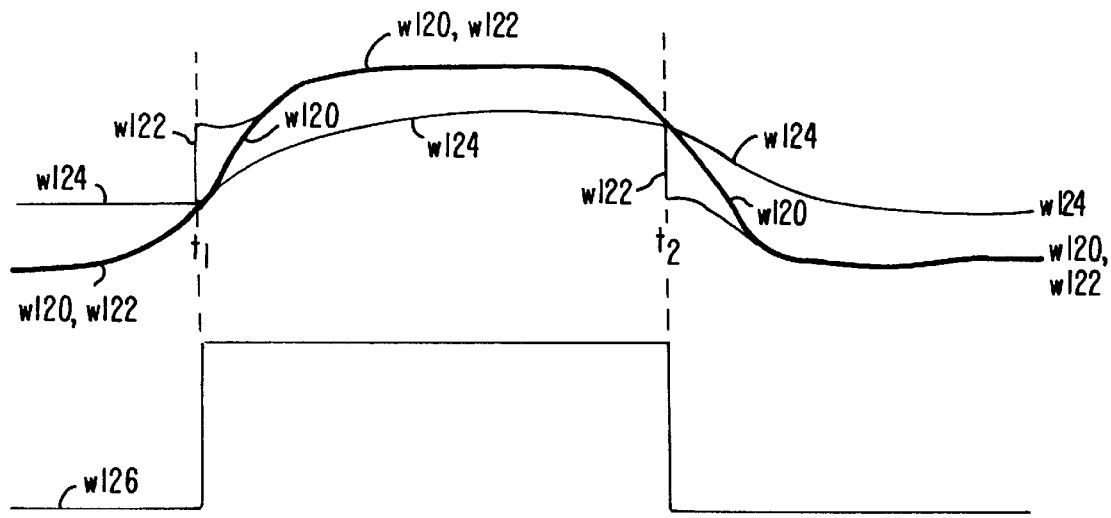
FIG. 8 is a set of waveforms of signals at nodes of the pulse detection circuit shown in FIG. 7.

An example of this is illustrated by waveform W120 in FIG. 8. The voltage at node 124 (W124), the threshold voltage, is kept away from the compared voltage at node 122 (W122) so that comparator 104 is not too sensitive to noise. The values of R2, C2, and R3 are selected such that the voltage at node 124 moves to a level set away from the voltage at node 122 by the time the next signal transition is expected. Node 122 receives positive feedback from node 126 to create a large, temporary hysteresis. This will provide ample noise immunity while the input signal is transitioning. The values of Ri and C1 are selected such that hysteresis is largely nonexistent when the next signal transition is expected.

The component values in pulse detection circuit 100 should be set based on some knowledge of the input signal for optimum performance. For example, if interference occurs only around the time of signal transitions, R2, C2 and R3 can be valued such that node 124 stays closer to the value of the input signal at node 120, to shorten the signal transition detection delay. The amount of hysteresis should be as large as possible, but not so large that the effect of the hysteresis is nonnegligible when the next signal transition is expected.

Figure 9:
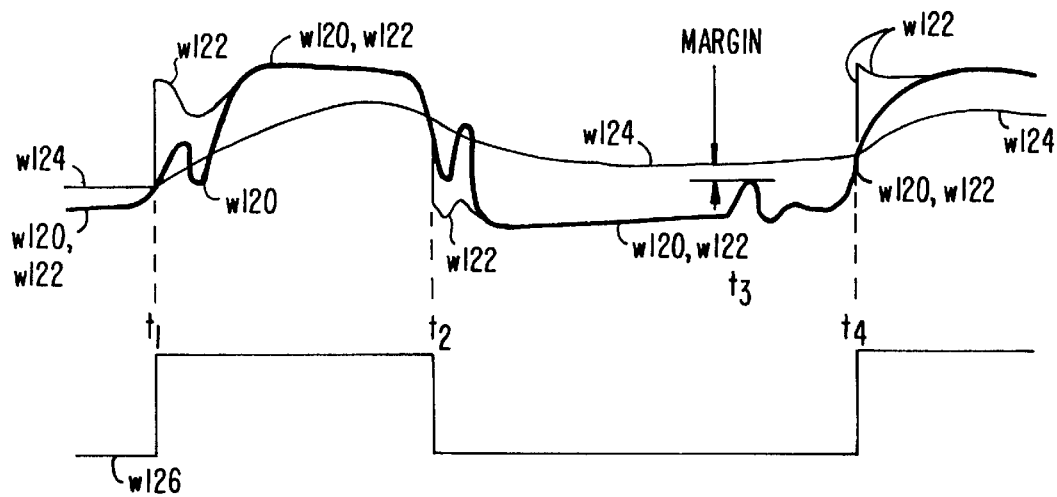
FIG. 9 is an additional set of waveforms representing a response of the circuit of FIG. 7 to a noisy input signal.

Referring now to FIG. 9, a set of waveforms is there shown which relate to the identified nodes of pulse detection circuit 100 shown in FIG. 7 for an input signal with noise. Waveform W120 is shown with a noise spike near times t1, t2 and t3 which, with some less robust pulse detector might result in a spurious pulse detection. However, as shown by waveform W126, the actual pulse is correctly detected. The hysteresis provided by the circuit moves the voltage at node 122 up sharply once a pulse is detected as the signal at node 122 crosses the voltage at node 124. Note that node 122 stays significantly higher than node 120 for long enough to avoid the noise but not long enough to miss the transition at t2. At t2, the voltage at node 122 drops sharply once the transition is detected again avoiding noise in the region of the transition. As FIG. 7 shows, the transition at output node 126 occurs when there is a change in sign of the relative voltage between nodes 122 and 124. Since node 124 is held away from the expected signal amplitude, ample margin exists for noise to occur between transitions, such as at time t3. At t3, noise on the signal input which does not exceed the voltage on node 124 will not cause a positive transition at output node 126.

As can be seen, if the time constants of the R-C networks are chosen properly, exceptional noise immunity for the transitions can be achieved. The noise at t1 and t2 does not affect the circuit because of the large temporary hysteresis provided at node 122. The noise at t3 also does not cause a problem, because the R2/R3 ratio has been chosen with enough margin. The signal-to-noise ratio does not change in the circuit, as it has a flat frequency response. Delay reduction is achieved by manipulating the detection threshold based on some known properties of the incoming signal.

Figure 10:
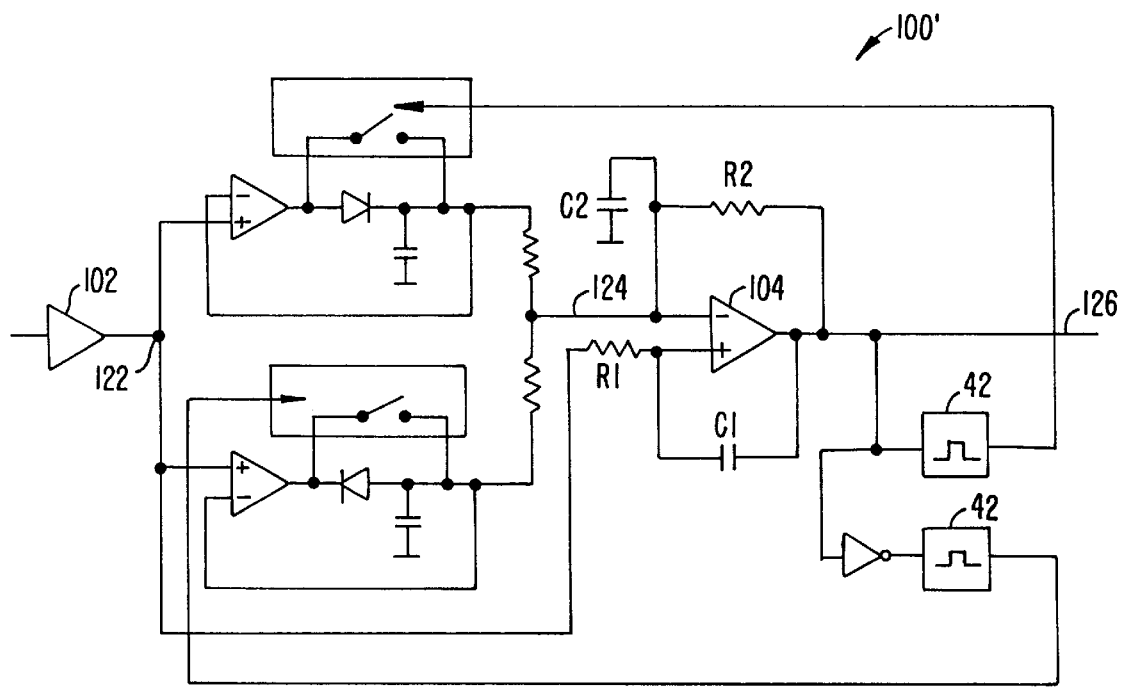
FIG. 10 is another embodiment of a pulse detection circuit according to the present invention which includes resetable peak detectors.

If the incoming signal amplitude varies greatly, the detection threshold can be manipulated by resetable peak detectors as shown by a modified pulse detection circuit 100' shown in FIG. 10.

The above description is illustrative and not restrictive. Many variations of the invention will become apparent to those of skill in the art upon review of this disclosure. Merely by way of example, R2, R3 and C2 might be replaced by a digital timing circuit which alters a voltage at node 124 of pulse detection circuit 100 based on criteria of the input signal. Furthermore, C1 and R1 might also be replaced by a digital timing circuit. The scope of the invention should, therefore, be determined not with reference to the above description, but instead should be determined with reference to the appended claims along with their full scope of equivalents.

What is claimed is:

1. A pulse detection circuit for filtering a pulse signal with noise superimposed thereon into a digital bi-level signal representing the pulse signal, wherein the pulse signal comprising predetermined signal criteria, the circuit comprising:

a comparator, coupled at a comparator output to an output of the pulse detection circuit, wherein the output of the comparator is a high signal when a first input voltage at a positive comparator input is higher than a second input voltage at a negative comparator input and wherein the output of the comparator is a low signal when the first input voltage is lower than the second input voltage;

a hysteresis circuit comprising a first impedance circuit coupled between the positive comparator input and the comparator output and a second impedance circuit coupled between an input node having thereon an input signal representing the pulse signal and the positive comparator input, wherein the hysteresis circuit is characterized by a first time constant having a value that is a first function of at least a first criteria of the predetermined signal criteria; and a reference circuit comprising a third impedance circuit coupled between the negative comparator input and ground and a fourth impedance circuit coupled between the comparator output and the negative comparator input, wherein the reference circuit is characterized by a second time constant having a value that is a second function of at least a second criteria of the predetermined signal criteria.

2. The pulse detection circuit of claim 1, wherein the first impedance is a capacitor and the second impedance is a resistor.

3. The pulse detection circuit of claim 1, wherein the first impedance is a resistor-capacitor network.

4. The pulse detection circuit of claim 3, wherein the resistor-capacitor network is a resistor and capacitor in series.

5. The pulse detection circuit of claim 3, wherein the resistor-capacitor network is a resistor and capacitor in parallel.

6. The pulse detection circuit of claim 1, wherein the second impedance is a resistor-capacitor network.

7. The pulse detection circuit of claim 6, wherein the resistor-capacitor network is a resistor and capacitor in series.

8. The pulse detection circuit of claim 6, wherein the resistor-capacitor network is a resistor and capacitor in parallel.

9. The pulse detection circuit of claim 1, wherein the third impedance is a capacitor and the fourth impedance is a resistor.

10. A pulse detection circuit for filtering a pulse signal with noise superimposed thereon into a digital bi-level signal representing the pulse-signal, wherein the pulse signal comprising predetermined signal criteria, the circuit comprising:

a comparator, coupled at a comparator output to an output of the pulse detection circuit, wherein the output of the comparator is a high signal when a first input voltage at a positive comparator input is higher than a second input voltage at a negative comparator input and wherein the output of the comparator is a low signal when the first input voltage is lower than the second input voltage;

a hysteresis resistor-capacitor circuit comprising a capacitor coupled between the positive comparator input and the comparator output and a resistor coupled between an input node having thereon an input signal representing the pulse signal and the positive comparator input, wherein the hysteresis resistor-capacitor circuit is characterized by a first time constant having a value that is a first function of at least a first criteria of the predetermined signal criteria; and a reference resistor-capacitor circuit comprising a capacitor coupled between the negative comparator input and ground and a resistor coupled between the comparator output and the negative comparator input, wherein the reference resistor-capacitor circuit is characterized by a second time constant having a value that is a second function of at least a second criteria of the predetermined signal criteria.

11. The circuit of claim 10, wherein the first criteria is characterized by a pulse width of the pulse signal.

12. The circuit of claim 10, wherein the second criteria is characterized by a signal input level of the pulse signal.

13. In a pulse detector, a method of detecting signal transitions in an input signal which is a binary data stream with noise superimposed thereon to form an output signal having transitions in correspondence with the signal transitions, the method comprising the steps of:

providing the input signal to a first input of a comparing means;

providing hysteresis between said first input and an output of said comparing means, said hysteresis characterized by a first time constant, wherein said first time constant has a value that is a function of at least a first criteria of the input signal;

providing a reference circuit between said output of said comparing means and a second input, said reference circuit characterized by a second time constant, wherein said second time constant has a value that is a function of at least a second criteria of the input signal.

14. The method of claim 13, wherein said step of providing hysteresis further comprises a step of characterizing said first criteria by a pulse width of the input signal.

15. The circuit of claim 13, wherein said step of providing a reference circuit further comprises a step of characterizing said second criteria by a signal input level of the input signal.

* * * * *